(12) United States Patent
Liou

(10) Patent No.: US 7,067,350 B1
(45) Date of Patent: Jun. 27, 2006

(54) METHOD OF MANUFACTURING A SEMICONDUCTOR DEVICE USING ELECTRICAL CONTACTS FORMED IN AN ISOLATION LAYER

(75) Inventor: Ping Liou, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 10/906,029

(22) Filed: Jan. 31, 2005

(51) Int. Cl.
H01L 21/44 (2006.01)
H01L 21/48 (2006.01)

(52) U.S. Cl. ..................... 438/106; 438/108
(58) Field of Classification Search .......... 438/106, 438/108; 257/778
See application file for complete search history.

(56) References Cited

U.S. PATENT DOCUMENTS 5,783,870 A * 7/1998 Mostafazadeh et al. ..... 257/791
6,190,940 B1 * 2/2001 DeFelice et al. ............ 438/106
2002/0109228 A1 * 8/2002 Buchwalter et al. ........ 257/738

* cited by examiner

Primary Examiner—Phat X. Cao
Assistant Examiner—Theresa T. Doan
(74) Attorney, Agent, or Firm—Baker & McKenzie LLP

(57) ABSTRACT

Disclosed are techniques for constructing a novel solder bump layout on substrates for bonding using flip-chip, wafer-level, or other similar techniques. In one embodiment, a method of manufacturing a semiconductor device provides for forming contact pads on a first substrate, and forming an isolation layer over the contact pads and the substrate. In addition the method includes forming openings in the isolation layer over the contact pads, and depositing metal in the openings and in electrical contact with the contact pads to form electrical contacts in the openings. Also in such embodiments, the method includes bonding exposed surfaces of the electrical contacts to corresponding bonding pads formed on an external surface of a second substrate. In these embodiments, the bonding is done such that the isolation layer is in contact with the external surface to provide electrical isolation between the first and second substrates and between the electrical contacts.

13 Claims, 6 Drawing Sheets

Bonding chip onto substrate---solder melting

Pad Formation or
Redistribution trace

Buffer Layer Deposition (Isolation material)

Resist Coating & Exposure of buffer layer

Buffer Layer etch & Resist strip

Solder material filling in bump hole
Sputtering or Plating

Resist Coating & Exposure of solder layer

Solder Etch & resist strip

METHOD OF MANUFACTURING A SEMICONDUCTOR DEVICE USING ELECTRICAL CONTACTS FORMED IN AN ISOLATION LAYER

FIELD OF ACTIVITY

This disclosure relates generally to manufacturing techniques for semiconductor devices, and more particularly to electronic package devices having electrical connections without an underfill process.

BACKGROUND

As semiconductor devices reach higher levels of integration, packaging technologies, such as chip bonding and wafer-level bonding, have become critical. Packaging of the IC chip accounts for a considerable portion of the cost of producing the device and failure of the package leads to costly yield reduction. As semiconductor device sizes have decreased, the density of devices on a chip has increased, along with the size of the chip, thereby making chip bonding more challenging. One of the major problems leading to package failure as chip sizes increase is the increasingly difficult problem of maintaining solid structural and electrical connections between contact/bonding pads on the two components being bonded together. For example, in flip-chip techniques, solder joints between the IC chip and the package substrate after the structures have been metallurgically bonded together may suffer structural deficiencies. The most common technique for improving the strength of the bond between the IC chip and the package substrate is the inclusion of an "underfill" material between the two and around the ball grid array (BGA) comprised of solder balls or bumps used to bond the two components.

The underfill material, which is a dielectric material, is typically injected or otherwise placed between the two components (e.g., an IC chip and a package substrate), and around the solder bumps forming the BGA bonding the two. Unfortunately, the underfill process often makes the assembly of electronic packages, a labor intensive, time consuming, and expensive process. The underfill process reduces production efficiency because the injecting and subsequent curing of the encapsulant material is a multi-step process, which requires the material to flow through tiny gaps between the two substrates being bonded. Also, as IC chip sizes increase, the flowing of the encapsulant material takes even more time, and becomes more susceptible to void formation when the density of the BGA increases, as with more complex chips. More specifically, as the pitch between adjacent solder bumps used to bond the two substrates decreases, uniform flow of encapsulant between the two substrates becomes even more difficult. Because voids are often the center of stress concentrations, and the residual gases inside such voids may expand when heated and cause damage, reliability of the electronic package is all too often an issue.

SUMMARY

Disclosed are techniques for constructing a novel solder bump layout on substrates or other components for bonding those components together using, for example, flip-chip or other similar techniques, where the technique eliminates the conventional underfill process currently employed. In one aspect, a method of manufacturing a semiconductor device is provided, and in one embodiment, such a method provides for forming contact pads on a first substrate, and forming an isolation layer over the contact pads and the substrate. The method includes forming openings in the isolation layer over the contact pads, and depositing metal in the openings and in electrical contact with the contact pads to form metal columns in the openings. Described methods also include metallurgically bonding exposed surfaces of the metal columns above the isolation layer to corresponding bonding pads formed on an external surface of a second substrate. In these embodiments, the isolation layer provides electrical isolation between the first and second substrates and between the metal columns.

Also disclosed is a semiconductor package device that includes a first substrate having contact pads, and an isolation layer formed over the contact pads and the substrate. The isolation layer has openings formed through it to the contact pads. In addition, the device includes metal columns formed in the openings and in electrical contact with the contact pads to make electrical contacts. A second substrate has bonding pads formed on its exposed surface. The first and second substrates are positioned to allow the surfaces of the electrical contacts above the isolation layer to be metallurgically bonded to corresponding ones of the bonding pads. Also, the isolation layer provides electrical isolation between the first and second substrates and between the electrical contacts.

DETAILED DESCRIPTION OF THE EMBODIMENTS

Figure 1A:
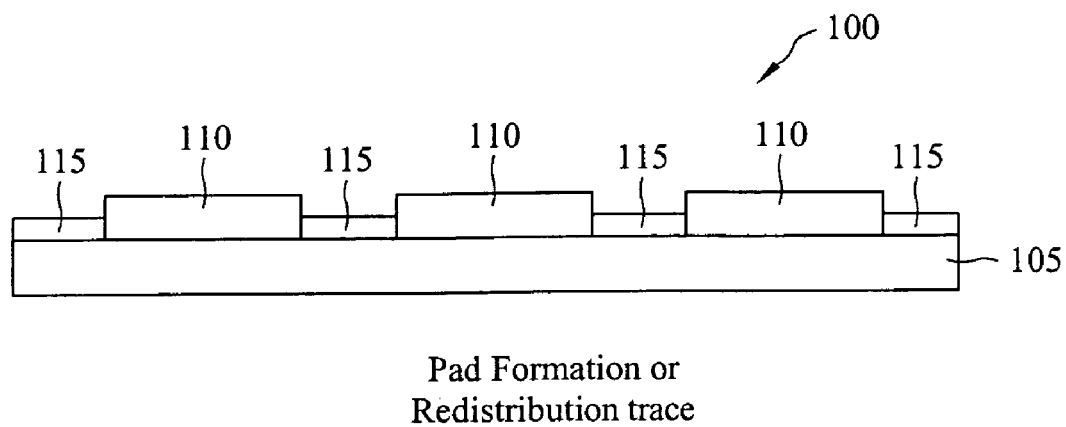
FIGS. 1A–1G illustrate one embodiment of an exemplary process for forming solder bumps on a semiconductor IC chip in accordance with the disclosed principles.

Referring initially to FIGS. 1A–1G, illustrated is one embodiment of an exemplary process for forming electrical contacts (e.g., solder bumps) on a semiconductor IC chip in accordance with the disclosed principles. Looking first at FIG. 1A, illustrated is an area of electrical contacts 100, which is the illustrated embodiment is an array of solder bumps 100, early in their formation process. These electrical contacts 100 may be used to provide an electrical and mechanical bond between two components, such as an IC chip and a printed circuit board or package substrate. As shown, a typical electrical contact area 100 includes a semiconductor substrate 105 with contact/bonding pads 110. The contact pads 110 are formed from an electrically conductive material, such as aluminum or copper, but no specific material is required. In other embodiments, redistribution traces may be formed on the substrate 105 using conventional techniques instead of forming typical contact pads 110, if desired.

Also often included is a passivation layer 115 typically constructed from dielectric material. If a passivation layer 115 is included, portions of this layer 115 over the contact pads 110 are removed, perhaps using conventional etching techniques, to expose corresponding parts of the contact pads 110. One or more under-bump metallization (UBM) layers (not illustrated) may then be formed over the passivation layer 115 and in electrical contact with the contact pads 110. Although not required, a UBM layer, for example, constructed using titanium, provides improved electrical and structural connection to the contact pads 110 when the electrical contacts (e.g., solder bumps) are formed. In other example, the UBM layer may simply be eliminated from the overall process to reduce manufacturing costs.

Figure 1B:
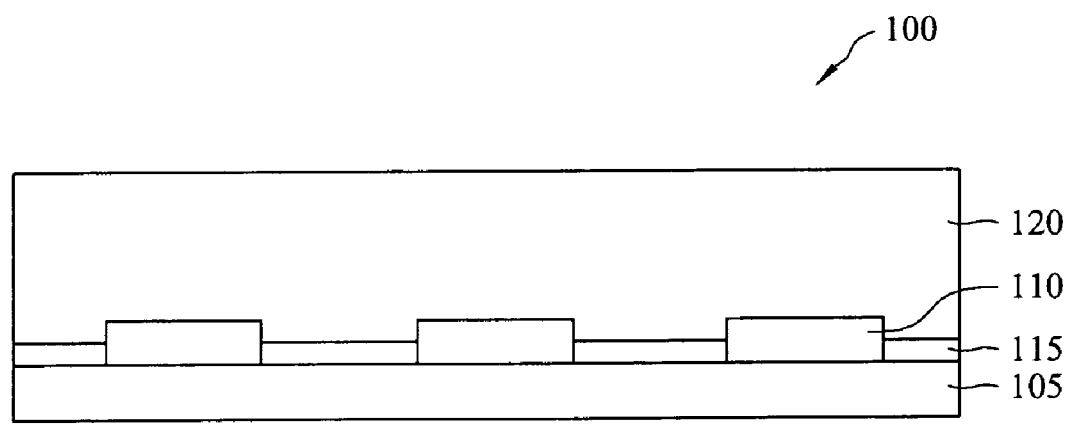

Referring now to FIG. 1B, the same electrical contact area 100 discussed above is shown, a little further into the bump formation process disclosed herein. Specifically, a buffer layer 120, or isolation layer 120 (or multi-layer with buffer material), is deposited over the contact pads 110 and the remaining portions of the passivation layer 115. The isolation layer 120 is formed from a dielectric material using any appropriate technique, for example, CVD method or spin-coating method, either now existing or later developed. For example, the isolation layer 120 may be formed using known oxidation processes, but any beneficial process may be employed. In advantageous embodiments, the isolation layer 120 may be comprised of an oxide, silicon oxide, silicon dioxide, silicon nitride, any polymer-based material, or other suitable materials (with stress-relief function, the buffer material would reduce thermal stress between wafer and package substrate). After formation of the isolation layer 120, the IC chip may be planarized to smooth and flatten the exposed surface of the isolation layer 120. For example, chemical mechanical polishing (CMP) techniques may be employed to planarize the isolation layer 120, but any beneficial technique may be used. While planarization may not be as critical at the current stage, when the package pitch becomes smaller, the planarization process typically becomes more important.

Figure 1C:
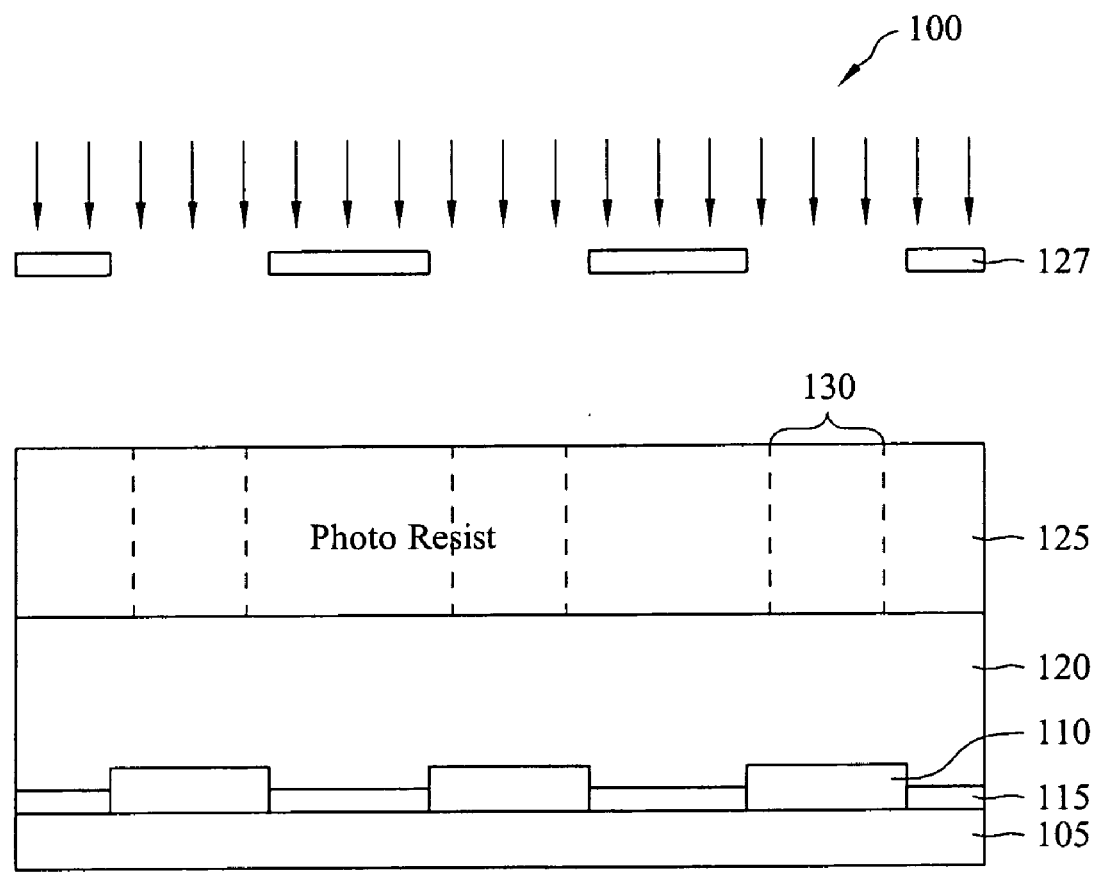

Turning now to FIG. 1C, illustrated is the electrical contact area 100 discussed above at a later stage of the disclosed manufacturing process. Specifically, a masking layer 125 is placed over the exposed surface of the isolation layer 120 so that certain portions of isolation layer 120 may be removed and other portions will remain. The mask layer 125 may be a photoresist layer 125 that has been deposited (e.g., using a spin-coating technique) over the isolation layer 120 during a photolithographic process. The photoresist layer 125 is patterned using, for example, one or more reticles 127 or other patterning device. The patterned photoresist layer 125 is then developed, typically using conventional techniques, to create a patterned mask covering specific portions of the electrical contact area 100. The portions of the electrical contact area 100 that are no longer masked by the photoresist layer 125 may then be removed through chemical etching. In the illustrated embodiment, trenches 130 leading down to corresponding contact pads 110 are formed using the photoresist layer 125 and an etching process.

Figure 1D:
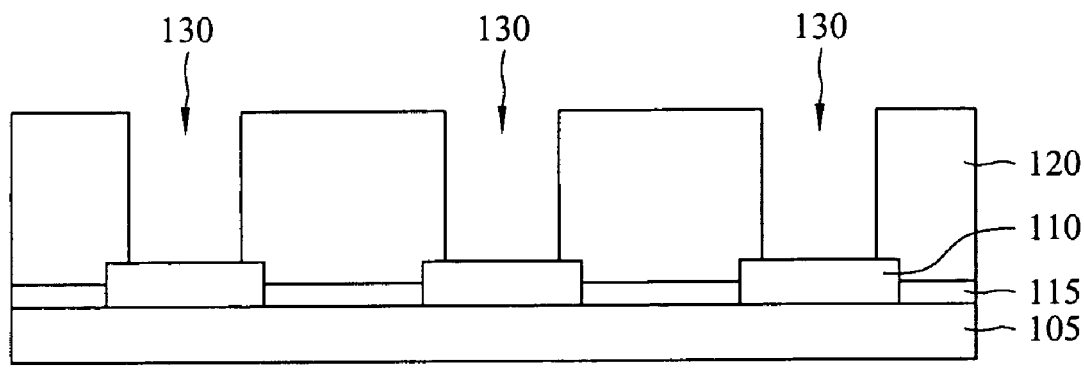

Turning now to FIG. 1D, illustrated is the electrical contact area 100 after the photoresist layer 125 has been removed. Specifically, once the photoresist layer 125 has been exposed and developed, the trenches 130 are etched into the isolation layer 120. Then, the remaining photoresist material from the photoresist layer 125 may be stripped, leaving the structure shown in FIG. 1D. As mentioned above, the trenches 130 formed in the isolation layer 120 are substantially inline with corresponding ones of the contact pads 110, which will allow solder material to reach the contact pads 110 to make the desired type of electrical contacts.

Figure 1E:
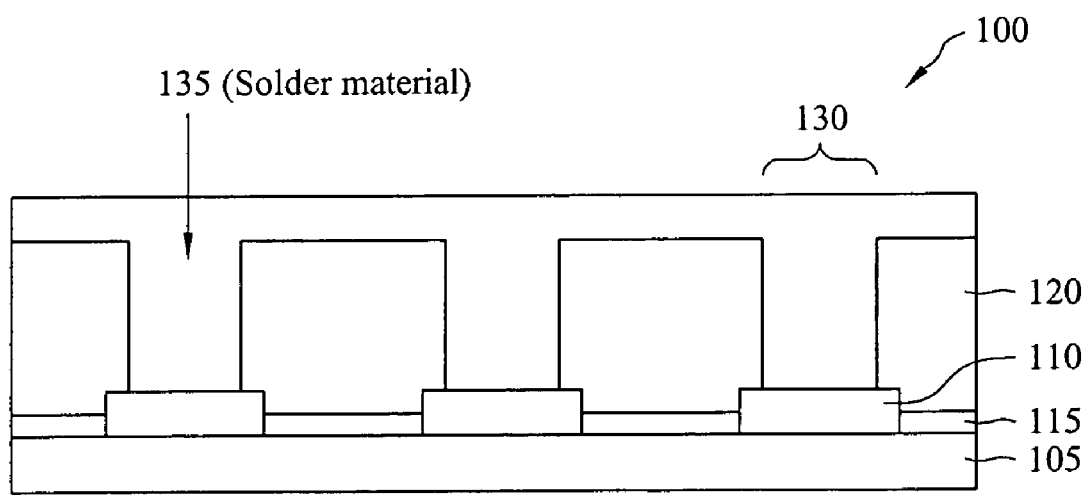
Figure 1F:
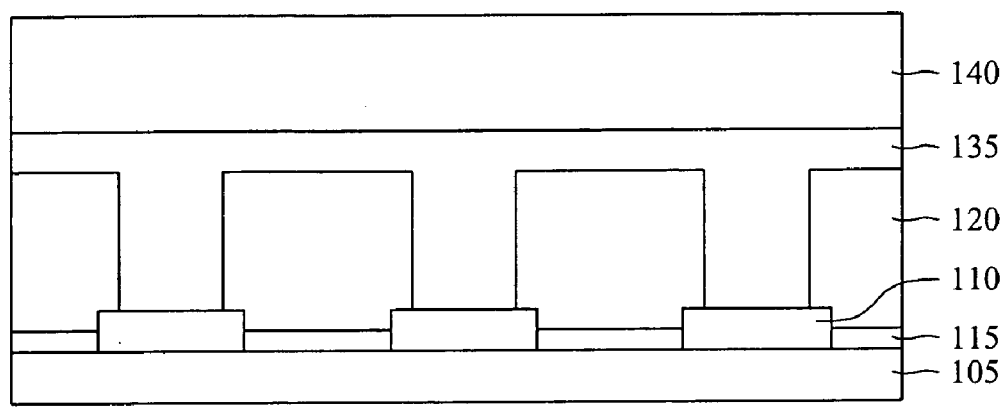

Looking briefly at FIG. 1E, illustrated is another section view of the electrical contact area 100 after the deposition of solder material 135. More specifically, the solder material, such as lead, a lead alloy, or a lead-free material, is deposited over the contact pads 110 and the isolation layer 125 to fill the trenches 130. The solder material may be deposited using techniques such as sputtering, plating, or other beneficial deposition technique. Then, looking at FIG. 1F, the electrical contact area 100 again undergoes a patterning process. In this patterning process, certain portions of the solder material 135 are removed based on a pattern using, for example, photolithographic techniques. As such, another photoresist layer 140 is spun-on or otherwise deposited over the solder material 135, which may also be done after the solder material 135 is planarized (although planarization is not required). As before, this photoresist layer 140 is patterned using a reticle 145 or other device, and exposed or developed to remove unwanted parts of the photoresist layer 140. Conventional etching techniques may then be used to remove uncovered portions of the solder material 135.

Figure 1G:
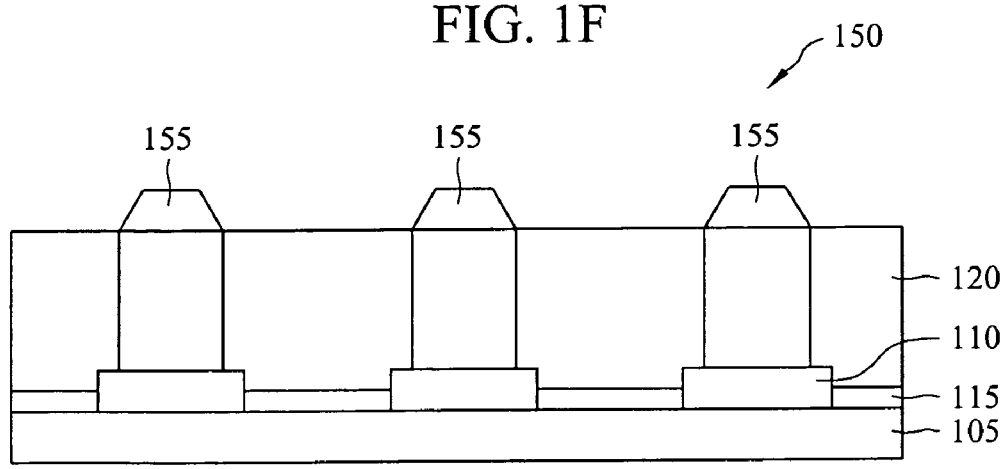

Turning now to FIG. 1G, illustrated is a finished electrical contact area 150 constructed according to the principles disclosed herein. As before, the electrical contact area 150 includes the semiconductor substrate 105 and contact pads 110 electrically interconnected with components (not illustrated) formed in the substrate 105. In addition, the finished electrical contact area 150 now includes solder columns 155 (or cylinders) having top portions protruding beyond (or "above") the isolation layer 120. The solder columns 155 are comprised of the solder material that extends down the etched trenches (or holes) and electrically contacts the contact pads 110, as well as portions of the solder material that remain extending beyond the isolation layer 120 after the etching step described with reference to FIG. 1F. The discussion with reference to FIGS. 2A–2B describes how the solder column structures 155 and the isolation layer 120 constructed in accordance with the disclosed principles are used to bond a first substrate to a second substrate.

Figure 2A:
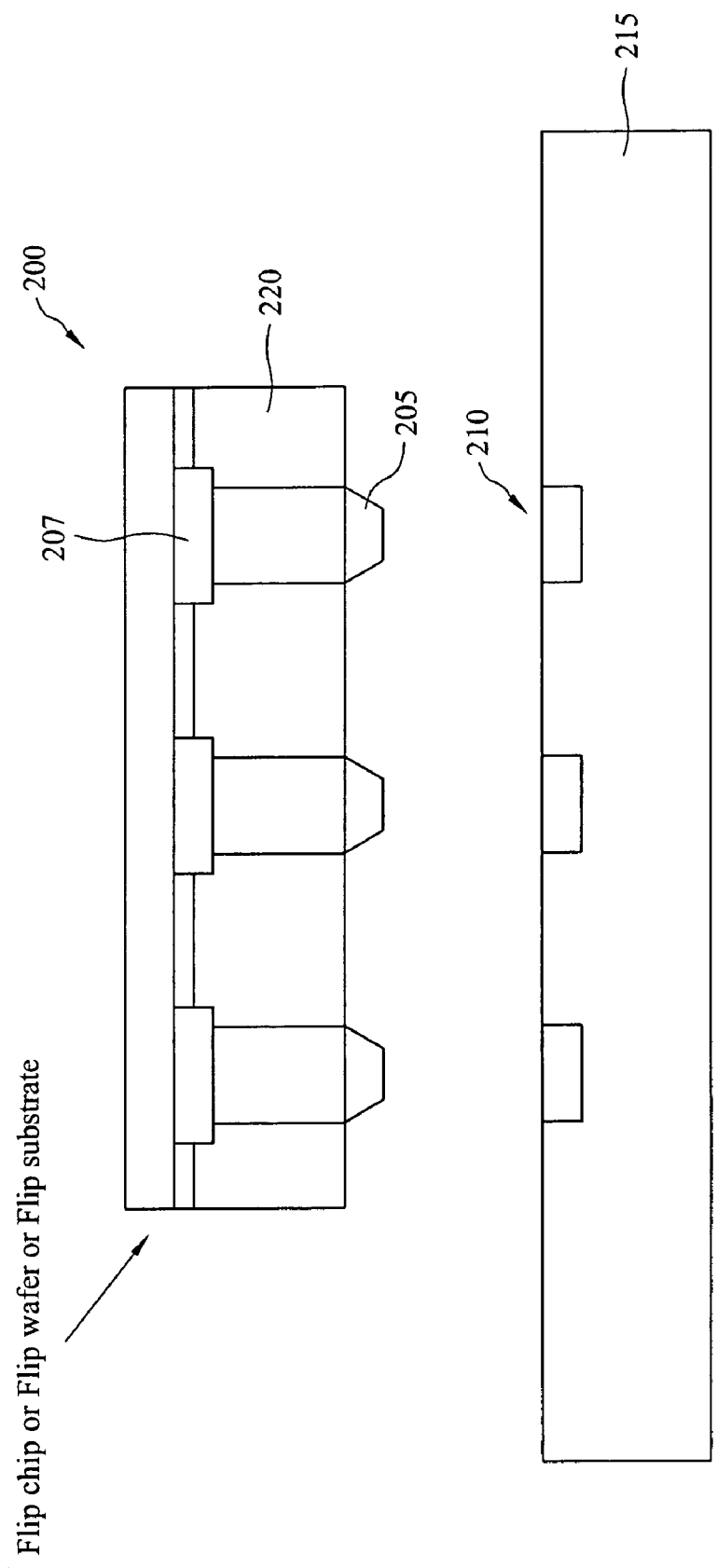
FIGS. 2A–2B illustrate one embodiment of the novel solder bump structures and isolation layer constructed according to the disclosed principles when used to bond an IC chip to a package substrate to form a semiconductor package device.

Referring now to FIG. 2A, illustrated is a portion of an IC chip 200 having electrical contacts 205 (which in this embodiment are solder bumps 205) formed thereon according to the novel technique disclosed herein. Of course, the electrical contacts 205 may also be formed on other structures, such as another type of substrate or surface. As mentioned above, the electrical contacts 205 are structurally and electrically connected to contact pads 207 on the IC chip 200. These electrical contacts 205 are formed in a pattern to correspond to other bonding or contact pads 210 formed on a second substrate 215 (e.g., a package substrate or a PCB) to which the IC chip 200 will be bonded using flip-chip techniques. In addition to flip-chip application, as mentioned above other applications, such as wafer-level packaging may also be accomplished using the disclosed techniques. For example, a 12-in wafer may be flipped over and bonded with a package substrate, or the package substrate may be flipped over and bonded with the surface of the 12-in wafer substrate by proper alignment. Moreover, these electrical contacts 205 are again formed within an isolation layer 220 in the manner described in detail above.

Figure 2B:
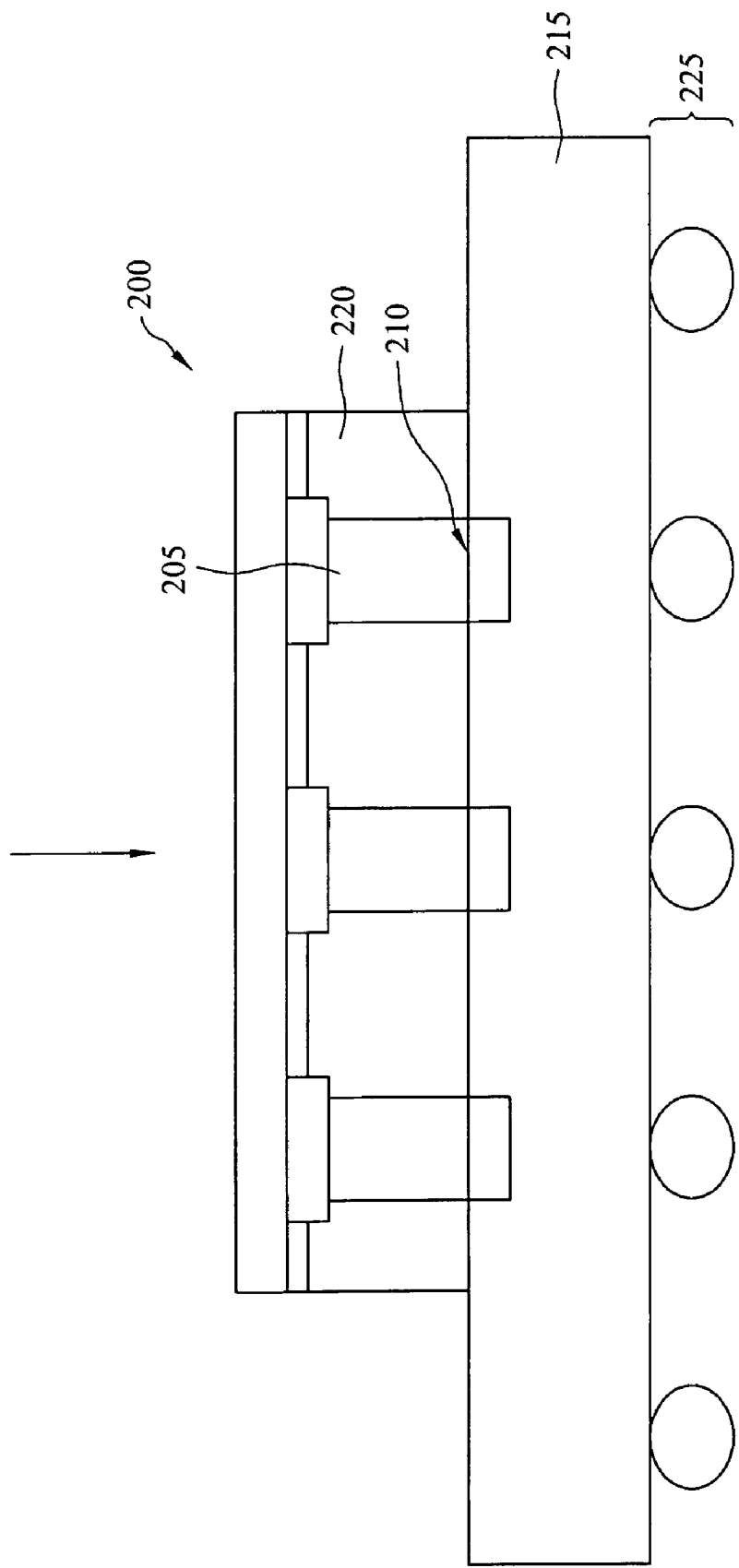

FIG. 2B shows the IC chip 200 and package substrate 215 metallurgically bonded using such flip-chip techniques. Specifically, the IC chip 200 is placed over the package substrate 215 such that the electrical contacts 205 contact the bonding pads 210 on the substrate 215. Then, a process is employed to temporarily melt the electrical contacts 205 so that they, when hardened, will metallurgically bond to corresponding ones of the bonding pads 210. In addition, while the metallurgical bond typically occurs at a high temperature level, the disclosed technique can also provide an adhesive bonding at lower temperatures. More specifically, to increase bonding strength between the two components, the disclosed technique may also include the use of an adhesive material on the top surface of the isolation layer, adjacent the electrical contacts.

Once the two substrates are bonded, the isolation layer 220 is in contact with the external surface of the package substrate to provide electrical isolation between the IC chip 200 and the package substrate 215, as well as between the multiple metal electrical contacts 205. In some embodiments, the isolation layer 220 may also be bonded to the exposed surface of the package substrate 215, for example, using an appropriate adhesive. In such embodiments, the bonding of the isolation layer 220 to the package substrate 215 provides even more structural support between the two substrates, as well as ensuring electrical isolation between the two by eliminating potential gaps between the isolation layer 220 and the exposed surface of the package substrate 215, and between the individual electrical contacts 205 themselves.

In addition, the package substrate 215 shown in FIG. 2B also includes its own solder bumps 225, which may be used to bond the package substrate 215 to another structure or device, such as a PCB (not illustrated). Also, the solder bumps 225 on the package substrate 215 may also be formed using the same novel techniques used to form the novel solder bumps discussed above, if desired, when the package substrate is constructed. As such, the disclosed technique is not limited to forming the unique solder bumps and accompanying isolation layer on semiconductor IC chips, but may be formed on any appropriate substrate or surface.

By forming an isolation layer over the contact pads of a substrate, and then etching trenches (or holes) in the isolation layer to fill with solder material that contacts the contact pads, the conventional process step of injecting or otherwise providing an underfill material between two joined substrates is eliminated. As a result, manufacturing costs associated with providing an underfill material are no longer an issue. In addition, in conventional solder bump formation, two distinct steps are typically employed to melt (and re-harden) the bumps: one to form the solder bumps on the substrate, and a second to melt the solder bumps to bond the two substrates together. With the disclosed technique, the initial step used to finish the formation of the solder bumps is also eliminated from the manufacturing process. Furthermore, manufacturing times may be decreased with the disclosed techniques since there is no longer a requirement to inject an underfill material, and then wait for the underfill material to cure, after the two substrates are bonded together. Decreased manufacturing times and costs translate into increased production at the same time and expense, which directly translates to increased profits. Moreover, since the disclosed techniques may be employed on any type of substrate or component, such manufacturing improvements may also be carried into other areas of manufacturing.

Although the above description sets forth advantages relative to certain prior art implementations, these examples and their performance specifications should not be construed in any way as limitations on the invention or inventions disclosed. The scope of coverage for any patent that issues shall be defined by the claims that any such patent contains. It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes that come within the meaning and ranges of equivalents thereof are intended to be embraced therein.

Additionally, the section headings herein are provided for consistency with the suggestions under 37 C.F.R. § 1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Summary of the Invention" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. A method of manufacturing a semiconductor device, the method comprising:
    forming contact pads on a first substrate;
    forming an isolation layer over the contact pads and the substrate;
    forming openings in the isolation layer over the contact pads;
    depositing metal over the isolation layer and in the openings, the metal in electrical contact with the contact pads to form electrical contacts in the openings; and
    removing portions of the metal not located over the contact pads; and
    bonding exposed surfaces of the electrical contacts to corresponding bonding pads formed on an external surface of a second substrate, the isolation layer contacting the external surface to provide electrical isolation between the first and second substrates and between the electrical contacts.

2. A method according to claim 1, further comprising forming an under-bump-metallization layer over each of the contact pads, and depositing the metal in electrical contact with the contact pads via the under-bump-metallization layers.

3. A method according to claim 1, wherein the bonding comprises metallurgically or adhesively bonding.

4. A method according to claim 1, wherein forming openings in the isolation layer over the contact pads comprises photolithographic masking of the isolation layer and forming the openings by etching the isolation layer.

5. A method according to claim 1, wherein the isolation layer is a material selected from the group consisting of oxide, silicon oxide, silicon dioxide, and polymer-based material.

6. A method according to claim 1, wherein the removing comprises etching the portions of the metal not located over the contact pads.

7. A method according to claim 1, wherein depositing metal comprises depositing metal in the openings using a sputtering or a plating process.

8. A method according to claim 1, wherein the metal comprises solder material selected from the group consisting of lead, lead alloy, and lead-free metals.

9. A method according to claim 8, wherein bonding comprises melting the solder material and then allowing the melted solder material to re-harden.

10. A method according to claim 1, wherein the first substrate comprises an IC chip having an active region in electrical contact with the contact pads.

11. A method according to claim 1, wherein the first substrate comprises an IC chip having an inactive region in electrical contact with the contact pads.

12. A method according to claim 1, further comprising bonding the isolation layer to the exposed surface.

13. A method according to claim 1, wherein the bonding is accomplished using an adhesive.

* * * * *